United States Patent
Al-Dabagh et al.

(10) Patent No.: US 6,907,590 B1
(45) Date of Patent: Jun. 14, 2005

(54) INTEGRATED CIRCUIT DESIGN SYSTEM AND METHOD FOR REDUCING AND AVOIDING CROSSTALK

(75) Inventors: Maad A. Al-Dabagh, Sunnyvale, CA (US); Alexander Tetelbaum, Hayward, CA (US)

(73) Assignee: LSI Logic Corporation, Milpitas, CA (US)

( * ) Notice: Subject to any disclaimer, the term of this patent is extended or adjusted under 35 U.S.C. 154(b) by 679 days.

(21) Appl. No.: 09/968,008

(22) Filed: Oct. 2, 2001

(51) Int. Cl.[7] ............................................. G06F 17/50
(52) U.S. Cl. ....................................................... 716/6
(58) Field of Search ............................................ 716/6

(56) References Cited

U.S. PATENT DOCUMENTS

| | | | |
|---|---|---|---|
| 5,535,133 A | 7/1996 | Petschauer et al. | |
| 5,555,506 A | 9/1996 | Petschauer et al. | |
| 5,596,506 A | 1/1997 | Petschauer | |
| 6,405,350 B1 | 6/2002 | Tawada | |
| 6,543,038 B1 * | 4/2003 | Tetelbaum | 716/6 |
| 6,543,041 B1 | 4/2003 | Scheffer et al. | |
| 6,584,602 B2 | 6/2003 | Ko | |
| 6,637,014 B2 * | 10/2003 | Casavant | 716/6 |
| 6,665,845 B1 * | 12/2003 | Aingaran et al. | 716/5 |
| 2003/0229873 A1 * | 12/2003 | Casavant | 716/6 |

* cited by examiner

*Primary Examiner*—Stacy A. Whitmore
(74) *Attorney, Agent, or Firm*—Fitch, Even, Tabin & Flannery

(57) ABSTRACT

A system, method and program product for designing integrated circuits. A design of an integrated circuit (IC) is analyzed to identify the longest path for each cell pair. The total path delay of each identified longest path is calculated. Net delays are calculated for each cell pair. A crosstalk overhead delay is calculated for each identified longest path using a stochastic model. The crosstalk overhead of each longest path is added to the calculated path delays. The circuit is redesigned to eliminate any path wherein the delay exceeds a maximum accepted delay. The stochastic model may be a tree-like structure derived from several completed integrated circuit designs, in particular from cell placement and wiring for each completed IC. The tree-like stochastic model corresponds crosstalk delays to technology wiring factors.

34 Claims, 10 Drawing Sheets

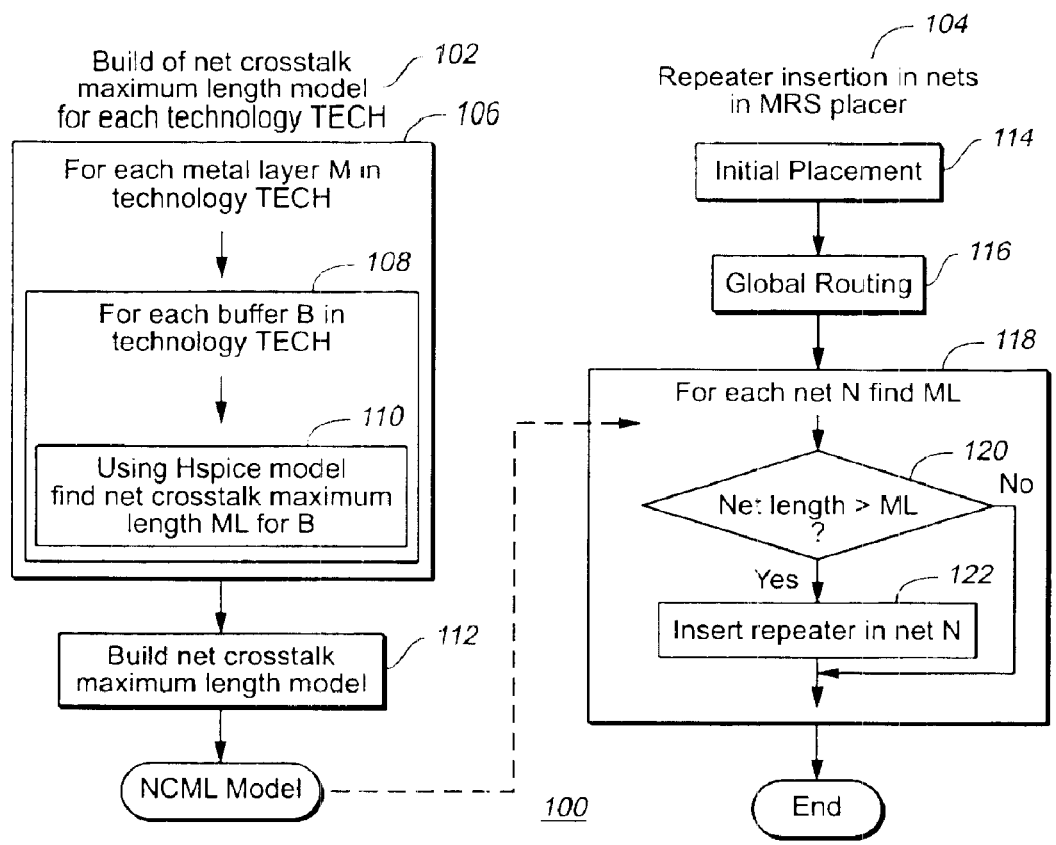
FIG._1
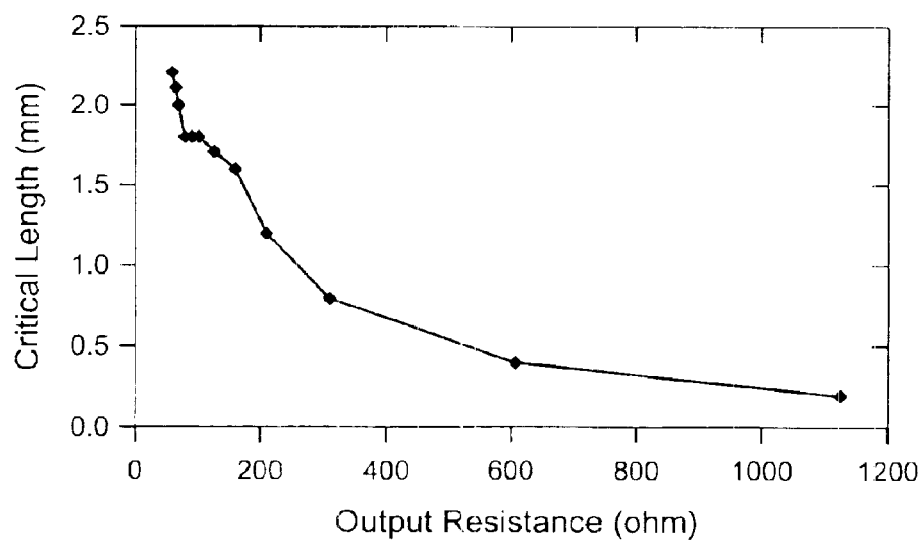
FIG._2

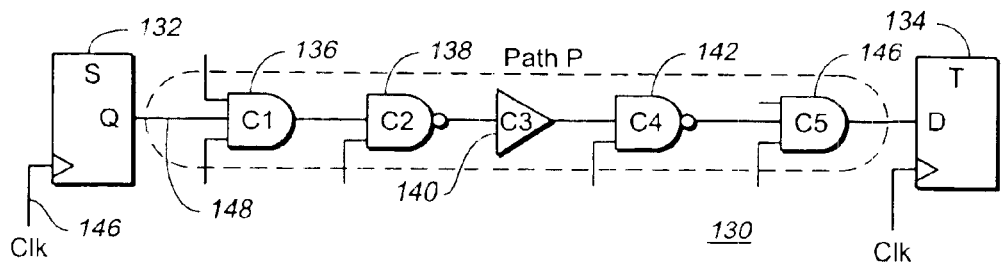
FIG._3
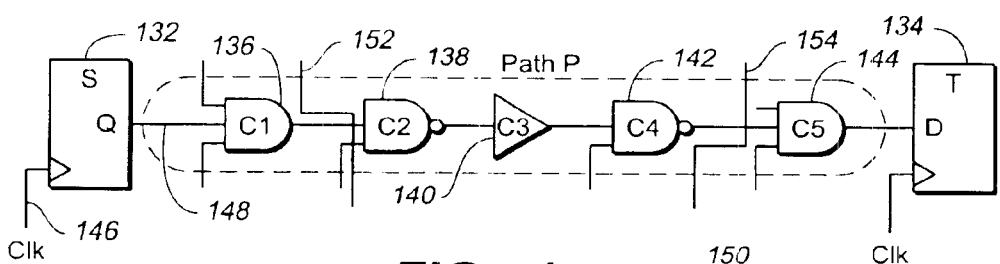
FIG._4
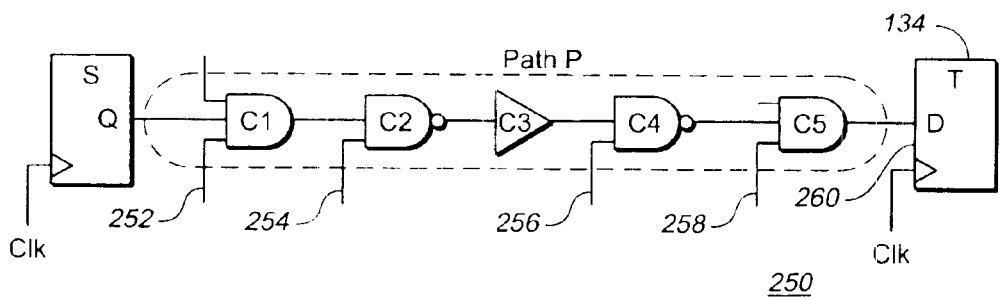
FIG._9

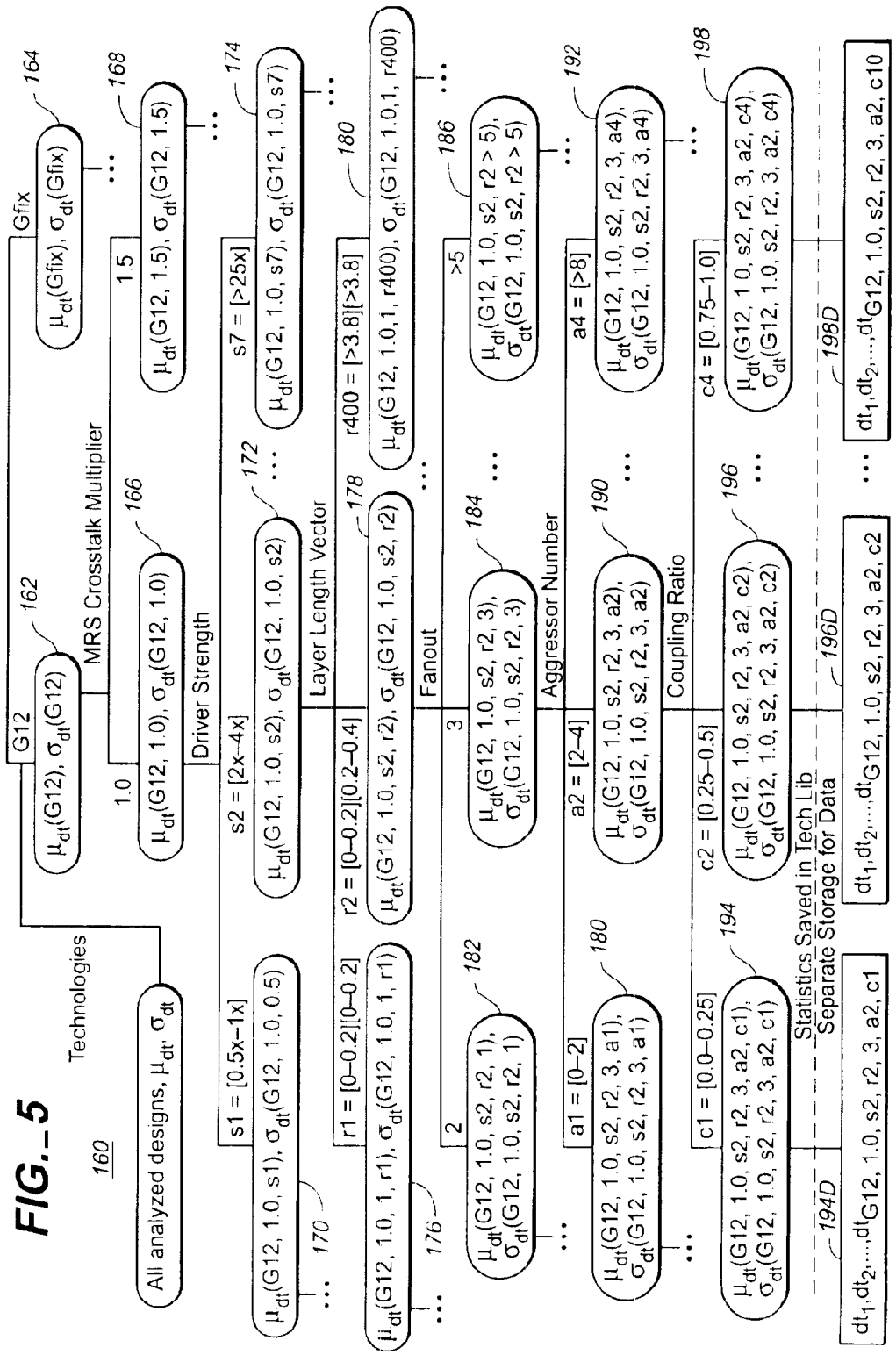

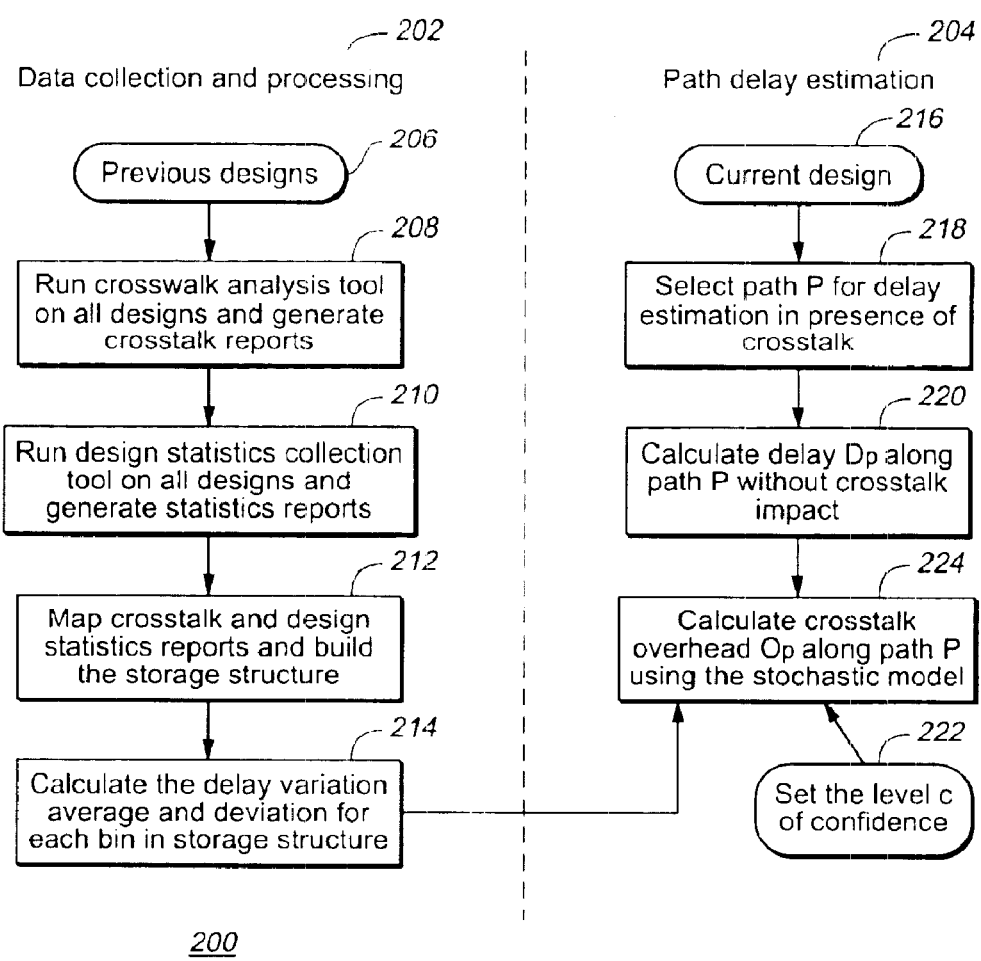
FIG._6

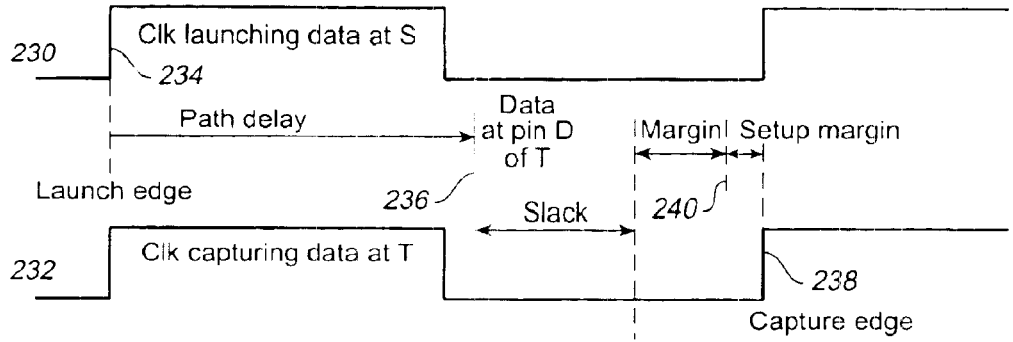
FIG._7
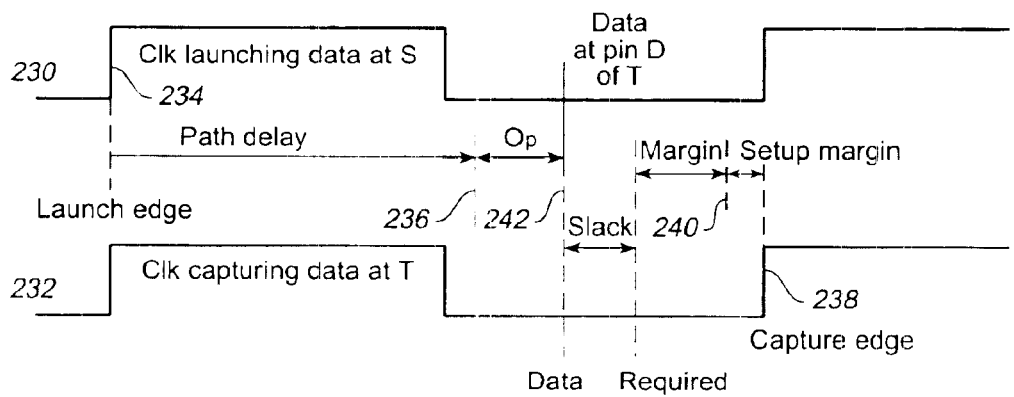
FIG._8
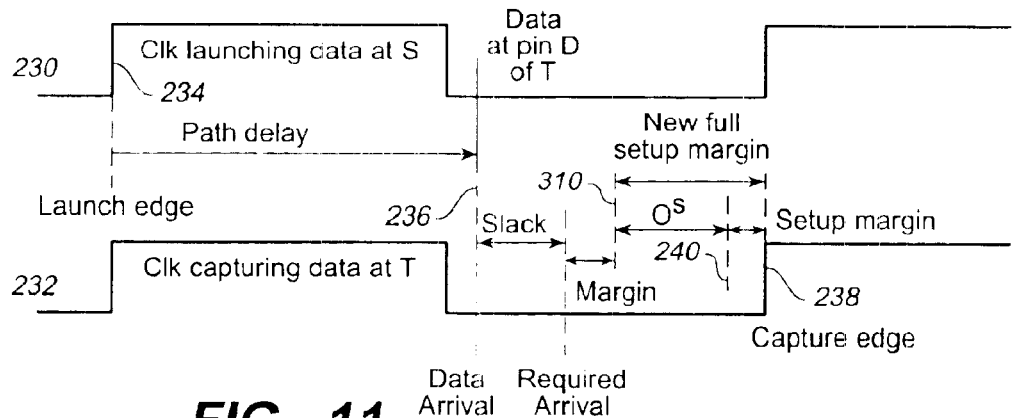
FIG._11

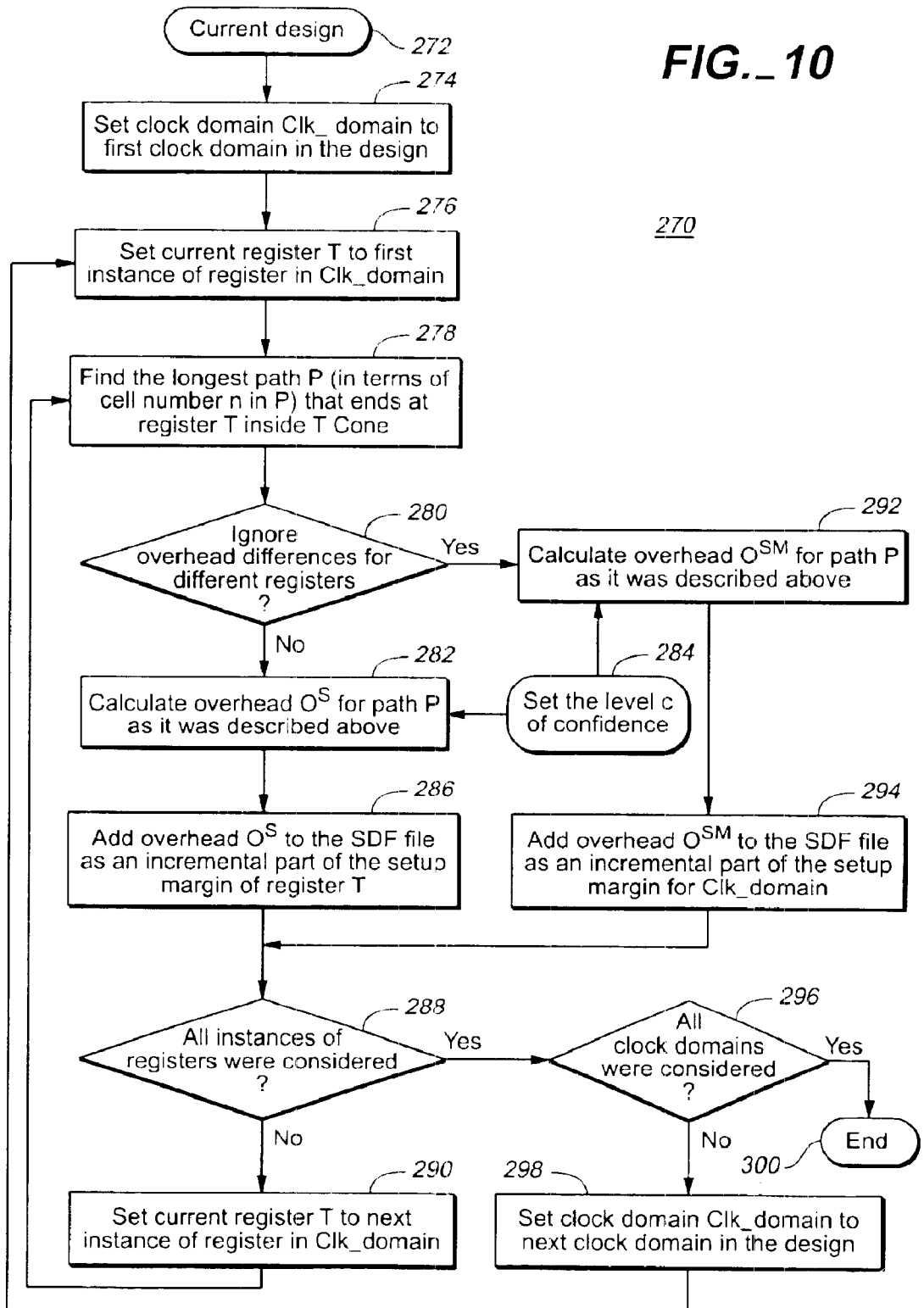
FIG._10

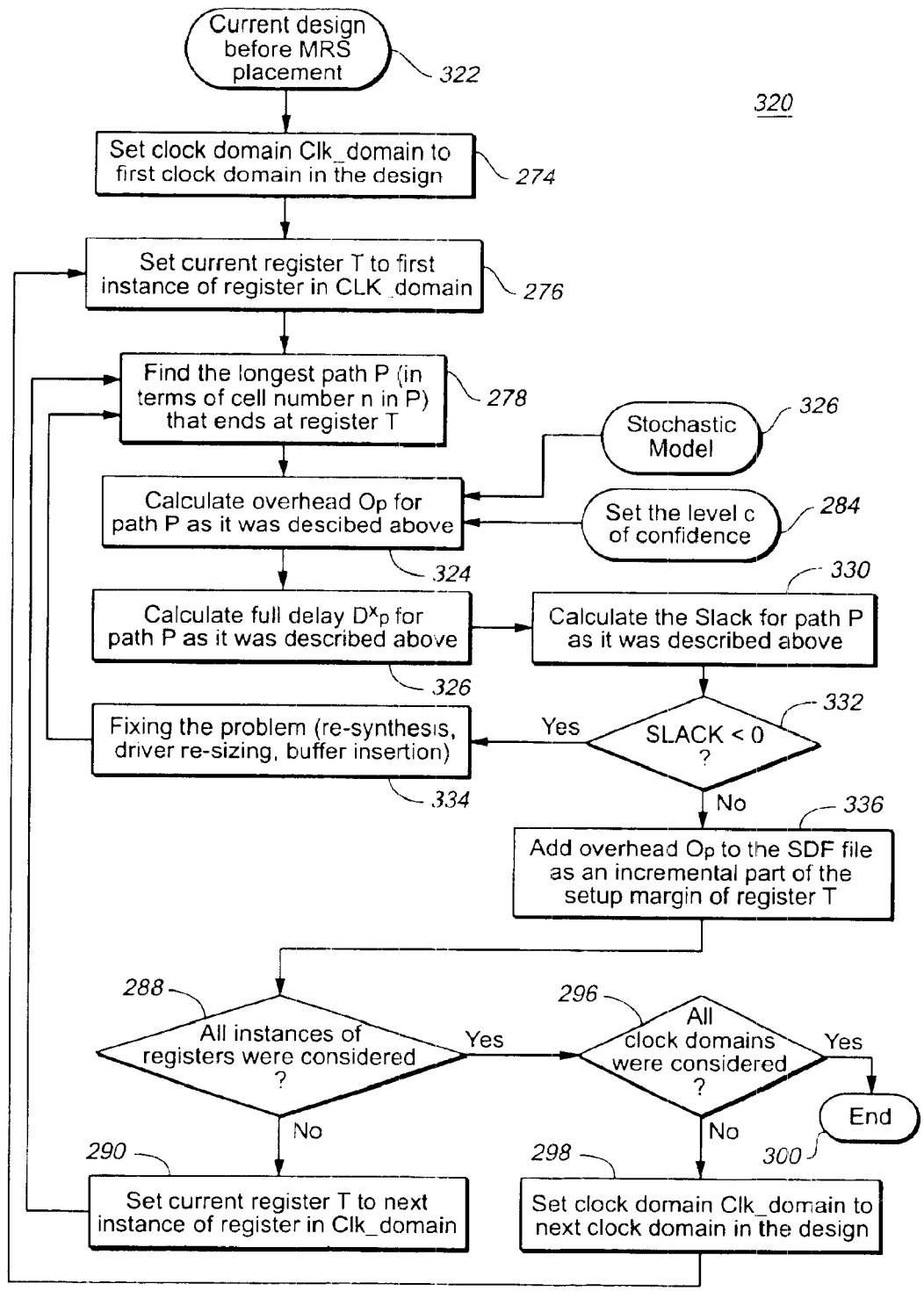
FIG._12

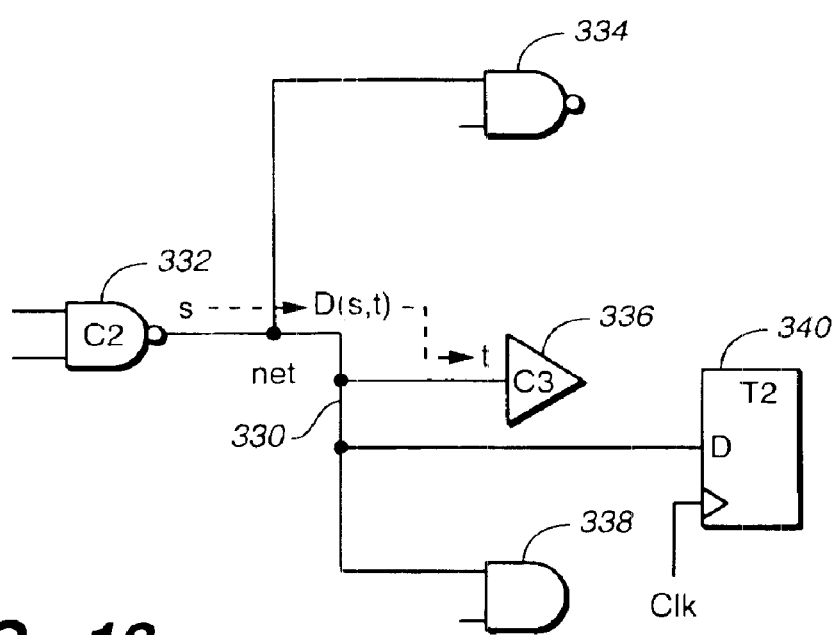
FIG._13

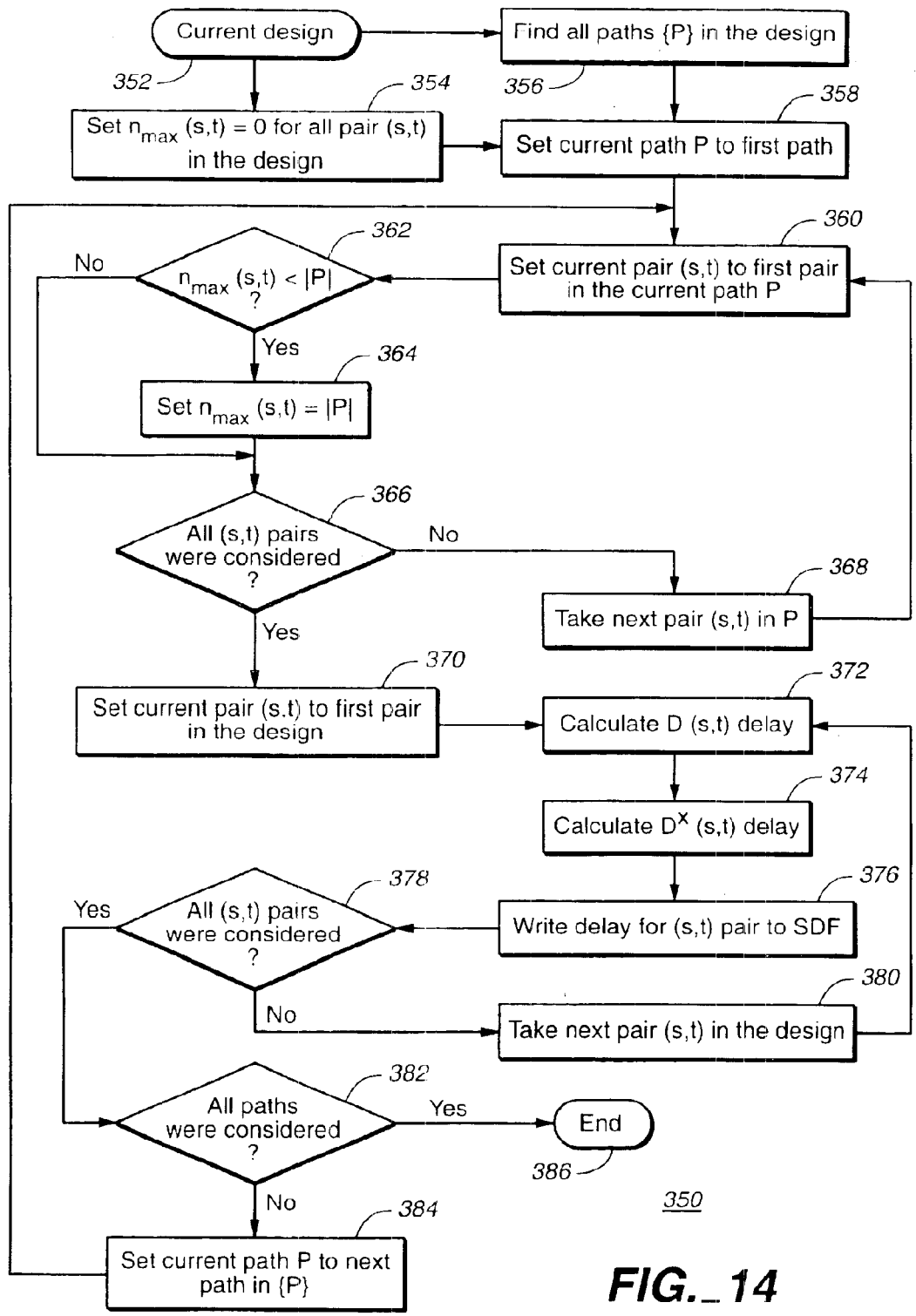
FIG._14

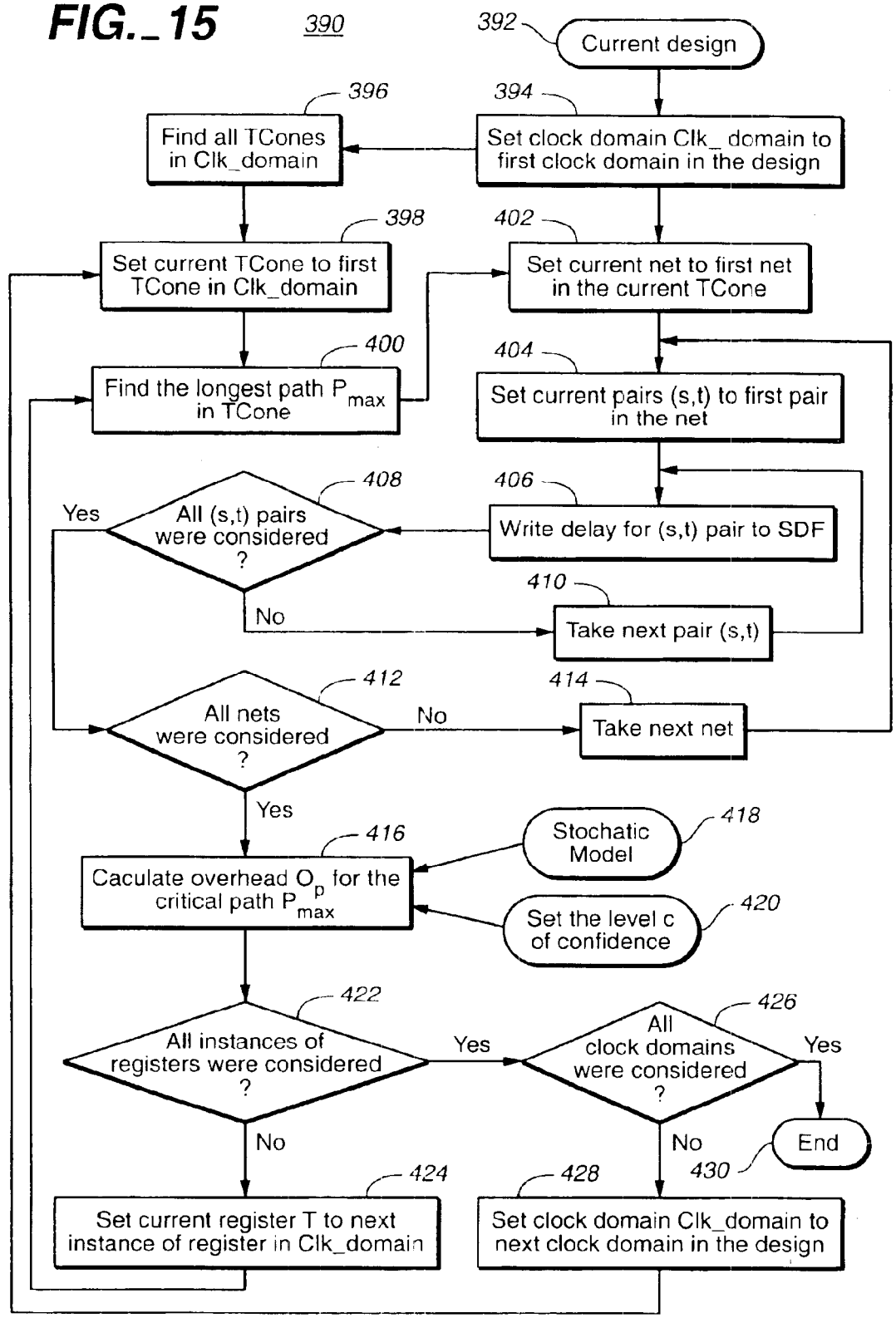
FIG._15

INTEGRATED CIRCUIT DESIGN SYSTEM AND METHOD FOR REDUCING AND AVOIDING CROSSTALK

CROSS-REFERENCE TO RELATED APPLICATIONS

This application is related to U.S. patent application Ser. No. 09/968,009 entitled "AN INTEGRATED CIRCUIT DESIGN SYSTEM AND METHOD FOR REDUCING AND AVOIDING CROSSTALK" of M. Al-Dabagh et al., filed concurrently herewith and assigned to the same assignee.

BACKGROUND OF THE INVENTION

1. Field of the Invention

The present invention is related to noise avoidance in logic design and more particularly to reducing noise in integrated circuit logic chip designs.

2. Background Description

Noise problems caused by cross coupling effects (crosstalk) from runs of parallel integrated circuit wires are well known in the art, especially for application specific integrated circuits (ASICs) designed in technologies based at 0.18 micrometers (microns) and below. Crosstalk can result in incorrect logic responses and, in the extreme, chip failure. Accordingly, to identify potential crosstalk, circuit analysis tools such as GateScope™ from Moscape, Inc. have been developed.

However, typically, these state of the art crosstalk analysis programs identify crosstalk errors only after circuit cell placement and wiring has been completed. At this point in the design, once crosstalk problems are identified, correcting crosstalk problems may require significant effort, e.g., re-placing cells and rewiring circuits or re-buffering individual cells and perhaps even redesigning the logic to split affected nodes. Accordingly, these prior approaches are time consuming and still may not lead to an acceptable chip design in a reasonable period of time.

Thus, there is a need for identifying potential crosstalk in integrated circuit designs.

SUMMARY OF THE INVENTION

The present invention is a system, method and program product for designing integrated circuits. A design of an integrated circuit (IC) is analyzed to identify the longest path for each interconnect. The total path delay of each identified longest path is calculated. Net delays are calculated for each interconnect. A crosstalk overhead is calculated for each identified longest path using a stochastic model. The crosstalk overhead of each longest path is added to the calculated path delays. The circuit is redesigned to eliminate any path wherein the path delay exceeds a maximum accepted delay. The stochastic model may be a tree-like structure derived from several completed integrated circuit designs, in particular from cell placement and wiring for each completed IC. The tree-like stochastic model corresponds crosstalk delays to technology wiring factors.

It is a purpose of the present invention to eliminate crosstalk from integrated circuit chips;

It is another purpose of the present invention to identify potential sources of crosstalk in an integrated circuit chip design prior to placement and wiring;

It is yet another purpose of the present invention to reduce the number of placement and wiring iterations required in integrated circuit design.

BRIEF DESCRIPTION OF THE DRAWINGS

The present invention is illustrated by way of example and not a limitation on the accompanying figures in which like references indicate similar elements and which:

FIG. 1 is a flow diagram of an initial crosstalk reduction step of the preferred embodiment of the present invention;

FIG. 2 is a graph showing comparison of cell output resistance versus critical wire length;

FIG. 3 is an example of a cross-section of a logic path between a starting register (memory cell) and a terminating register;

FIG. 4 is an example of the logic cross section with aggressor wires included;

FIG. 5 shows an example of a tree-like classification structure;

FIG. 6 shows a flow diagram exemplary of a step of generating average per stage crosstalk related delays for a coarse pre-wiring crosstalk analysis model;

FIG. 7 is an example of a timing diagram for a typical path timing relationship between a start register and a terminal register;

FIG. 8 shows inclusion of crosstalk overhead in path delay analysis for a closer, more accurate arrival time estimate;

FIG. 9 shows a Tcone path for a terminal register;

FIG. 10 shows an example of a refinement step for setting and adjusting timing margins for path crosstalk delay analysis;

FIG. 11 shows a timing diagram illustrating an incremental addition of the crosstalk overhead value to the setup margin as a result of the identified crosstalk setup overhead;

FIG. 12 shows another example of a path;

FIG. 13 is an example of a cross section showing an intersecting net in further detail;

FIG. 14 is an example of a flow diagram for first calculating individual net delays for the path according to the preferred embodiment of the present invention; and FIG. 15 is a flow diagram of a second net delay calculation mode according to the preferred embodiment.

DESCRIPTION OF PREFERRED EMBODIMENTS

Turning now to the drawings and more particularly, FIG. 1 is a flow diagram of an initial or coarse crosstalk reduction step 100 of the preferred embodiment of the present invention. This global crosstalk reduction step includes two major steps. The first major step 102 is a predesign phase or step, wherein wires are characterized for a particular technology to determine a critical length for wires at each metal layer. The second major step 104 is a segmentation step wherein, after placement, repeaters or buffers are inserted into any nets that have a total wire length greater than a technology defined critical length prior to cell wiring, thereby heading off any crosstalk that might otherwise occur.

So, first, a net crosstalk maximum length (NCML) model is generated in step 102 for each existing technology. For each net a given crosstalk delay uncertainty (CDU) is assumed, e.g., 100 picoseconds (100 ps). The CDU is selected to be maintained within a specified design margin, for a particular cell library, in the particular technology selected. The NCML model is generated using worst case power, worst case voltage and worst case temperature, as applied to the situation wherein, two aggressor nets (nets inducing noise into the net being analyzed) run parallel to the victim (the net being analyzed). Using the well known principle of superposition, wires are alternately victims (e.g., when being analyzed for NCML) and, otherwise, aggressors. Further, during this analysis the victim net is taken to switch simultaneously with only one aggressor switching in the direction opposite. Iteratively considering every cell in the cell library, a maximum length is characterized depending on the fan out of the net and the metal loading of the net, as defined by the net length and cell drive.

Thus, in first step 102 for each technology being analyzed, each metal layer is selected for characterization in step 106. Next, in step 108 buffer instances are identified for the design. Then, in step 10 the net crosstalk maximum length is identified for that buffer. In step 112 the net crosstalk maximum length model is generated for that technology and is a function that relates wire critical length to cell output resistances as described hereinbelow.

After the net crosstalk maximum length model is generated for a particular technology, it may be applied to nets in new designs in segmentation step 104. So, in step 114 an initial placement is made for a new design. Continuing to step 116 a global wiring routing is done for that initial placement to find a coarse locational relationship between cells in the same nets. In step 118 a maximum length is generated for each routed net using the NMCL model. In step 120 each net is checked to determine if it exceeds the maximum length for that net. Any net exceeding the maximum length is segmented and a repeater is inserted between net segments in step 122. After inserting repeaters, the likelihood of crosstalk has been significantly reduced and wiring may continue as normal.

FIG. 2 is a graph showing the critical length of wires as a function of cell output resistance (which is technology dependent) for the cell driving the wire. Since drive transconductance for a driver is represented by $$\frac{1}{R_{out}},$$

where $R_{out}$ is the output resistance exhibited by the driver cell, the cell output resistance is an indication of drive strength for the cell. Thus, output resistance corresponds to an acceptable maximum net length, i.e., an upper limit to the distance between cells on the same net. Additionally, critical length is technology dependent and, more particularly, in any technology critical length depends upon the wiring layers for the particular wire. Thus, a wire on a second layer of metal which has a narrow pitch may have a shorter critical length, e.g., 2.4 millimeters, than a wire on an upper layer of metal, such as a fourth layer of metal which has a wider pitch and so, may have a critical length of 4 millimeters.

Therefore, the relationship between the output resistance and the maximum length (ML) for a net may be described by the relationship $$ML = \frac{1}{f(R_{out})}.$$

In particular, $f(R_{out})$ may have the form of a simple linear equation to a close approximation, i.e., $f(R_{out})=a \times R_{out}+b$ and, therefore, $$ML \cong \frac{1}{aR_{out}+b}.$$

Table 1 below shows a comparison example of coefficient a and offset constant b for both wires on a second layer of metal (M2) and on a fourth layer of metal (M4), each being driven by a cell having a drive resistance of 65 Ω. The maximum length for a wire entirely on M2, for the example of Table 1, is 2.4 millimeters and, 4 millimeters for M4. Accordingly, the ML may be determined for a given driver driving a wire on any selected layer or combination thereof using the above relationship in combination with an appropriate technology table, such as Table 1. Then, for a rough cut, nets that exceed the maximum length for a particular layer or, for a combination of layers are segmented and drivers are inserted between the segments to reduce the level of crosstalk in the net segments.

TABLE 1

|    | a        | b        | ML for buff |
|----|----------|----------|-------------|
| M2 | 0.004189 | 0.144669 | 2.4 mm      |
| M4 | 0.004371 | 0.0239   | 4 mm        |

Thus, having identified any nets that exceed the maximum length, segmenting those nets and inserting repeaters between most segments, crosstalk concerns have been attenuated. Thus, the initial crosstalk reduction step of FIG. 1 provides an excellent first cut to eliminate the majority of crosstalk errors and, in many cases, may be sufficient that running crosstalk analysis tools on a subsequently wired final design does not identify any crosstalk sensitivities. However, there are other ways in which crosstalk still may effect the circuit performance.

FIG. 3 is an example of a logic cross-section path 130 between two registers, starting register 132 marked with an S and a terminating register 134 marked with a T. Further, the path 130 includes several cells 136, 138, 140, 142 and 144, representative of logic gates in any typical logic path. Normal circuit design analysis provides propagation delays between the start register 132 and the terminating register 134 based on cell or gate delays (cell input to output) and delays for wiring between the gates. In the absence of crosstalk (the normal design analysis assumption for prior art logic design systems) the propagation delay along path 130 is approximated as a sum of the cell delays and any wiring delays between cells. Thus, path propagation delay can be represented as:

$$D_P = T_{S(Clk,Q)} + \sum_{i=1}^{n}(T_{W(Out_{i-1},In_c)} + T_{C(In_i,Out_i)}) + T_{W(Out_n,D_T)}$$

where $T_{S(Clk, Q)}$ is a delay through register 132 from Clk input 146 to Q output 148;

$T_{W(Out_{i-1}, In_i)}$ is the wire delay between the output of cell i-1 and the input to cell i;

$T_{C(In_i,Out_i)}$ is the cell delay from input to output of cell i. Normally, design proceeds, placing gates and then wiring the gates after placement.

The wired circuit 150 of FIG. 4 is identical to the originally designed circuit 130 of FIG. 3, except aggressor wires 152, 154 have been added during wiring. Wiring analysis is done on a resulting placed and wired circuit such as this. Crosstalk from these aggressor wires 152, 154, may increase or decrease wiring delays $T_W$ in the path by some value (dt) which may be a function of several wire factors, i.e., dt(WireFactor). Each net can be wired through several different available wiring layers. State of the art delay estimation and crosstalk analysis tools calculate pin-to-pin wire delays between cells within the net.

Wiring delays $T_W$ within any path are affected by several wiring factors which also affect crosstalk. Typically, these factors may be categorized to include a technology dependency factor, a driver strength factor, a factor that is representative of the strength of the driver driving the cell (as indicated by the driver resistance or transconductance), the wire's layer lengths on each particular layer, the net fan out, existence of any wires adjacent to the net, and the number of potential aggressors (i.e., the number of adjacent wires). These are all considered in a normal crosstalk evaluation of the wired design. Further, an aggressor coupling ratio is the ratio of total aggressor length to the wire, which is yet another factor. In addition, a crosstalk multiplier may be included to analyze the overall effect of crosstalk on the particular net. This additional crosstalk delay (dt) can be inserted into the above delay equation to result in a more representative relationship:

$$D_P^X = T_{S(Clk,Q)} + \sum_{i=1}^{n}(T_{W(Out_{i-1},In_i)} + dt_i(WireFactors) + T_{C(In_i,Out_i)}) + T_{W(Out_n,D_T)}$$

Where $dt_i$(WireFactors) provides additional crosstalk delay with respect to all of the above mentioned wiring factors. Accordingly, it is understood that if crosstalk acts to reduce delays, crosstalk is not a problem and need not be considered. Therefore, for the worst case scenario crosstalk is taken to increase the path delay, for example, to the point where insufficient time is provided prior to clocking terminating register T. Thus, the delay difference (dD), between an initial design and the final placed and wired circuit is simply the difference between the above two equations, i.e., $$dD = D_P^X - D_P = \sum_{i=1}^{n} dt_i,$$

So, this path crosstalk delay difference dD for any path is a function of the wire factors for the wires within that path and, may vary for each path and for different critical paths. This difference may be characterized for a particular technology from previously established chip designs and, by varying wire factors for each characterized chip design, a mean value for a wire delay adder ($\mu_{dt}$), as well as a standard deviation ($\sigma_{dt}$), may be derived for each particular technology and any particular chip. Further, these chip mean values and standard deviations may be processed statistically to derive an overall mean value and standard deviation for a particular technology which may then be applied to subsequent designs to project expected crosstalk delay on individual nets.

In particular, the path delay may be modeled taking into account a crosstalk delay overhead ($O_P$) on an n cell path. The path delay in the presence of crosstalk can be represented as $$D^{PX} = D_P + O_P$$

where the crosstalk delay overhead is $$O_P = \sum_{i=1}^{n} \mu_{dt}(WireFactors) + c \cdot \sqrt{\sum_{i=1}^{n} \sigma_{dt}^2(WireFactors)}$$

where: $\mu_{dt}$(WireFactors) is the mean value of the wire delay addition dt for each wire with respect to wiring factors; $\sigma_{dt}$(WireFactors) is a standard deviation of the value of dt; and, c is the design confidence level. So, for example, c=1 selects the one $\sigma$ confidence level at 87% confidence, c=2 selects the two $\sigma$ confidence level at 97% confidence and c=3 selects the three $\sigma$ confidence level at 99% confidence. Thus, having derived the mean and standard deviation of crosstalk delay additions, delay through each path including crosstalk may be determined with a 99% confidence level for each path.

Thus, crosstalk may be calculated for all nets prior to wiring, and, if necessary, path adjustments may be made to reduce delay through a particular path to maintain critical timing within design constraints for all paths on the same chip. Further, since during the initial design stages, both prior to placement and during placement, most of the wire factors are unknown, e.g., individual net lengths and wire layers used for each net. So, an abbreviated wire factors list may be used for a quick initial delay calculation. For example, for an initial calculation, wire factors may be restricted to driver strength, net length, fanout, aggressor number and coupling ratio. Also, some wire factors may change during design, e.g., net fanout during resynthesis, driver strength of the net from cell resizing or, even, net length as a result of re-placement or rerouting the net. So, this initial abbreviated list provides sufficiently comprehensive analysis at these initial design stages.

Thus, wiring data statistics may be collected to relate wiring factors to delays for a particular technology and, then periodically, the statistics are updated and maintained for that technology. For this purpose, the collected statistics may include individual net crosstalk delays from a particular design (for example {$dt_1$, $dt_2$, . . . }), the average of those crosstalk delays, as well as the mean crosstalk delay value ($\mu_{dt}$) and standard deviation value $\sigma_{dt}$ which are both functions of wire factors. These delays are binned according to related wire factors and both the tree-like binning structure and the delays are saved for subsequent use and analysis. It should be noted that raw crosstalk delay data, i.e., {$dt_1$, $dt_2$, . . . } may be saved independently of, and separately from the computed wire factor mean and standard deviation values. Thus having computed the mean of the standard deviation values, a statistical representation has been extracted which may be used to predict the expected crosstalk delay for any number of cells or stages between two cells (starting and terminating cells) in any path. Then, using these representative values, the crosstalk delay overhead may be predicted for any path of n cells, in particular using the relationship:

$$O_P^S = n \cdot \mu_{dt} + c \cdot \sqrt{n} \cdot \sigma_{dt},$$

for the most abbreviated wire factors. As a result, by considering each wire independently and using chip average WireFactor parameters, a close estimate of the path crosstalk is achieved such that crosstalk is predicted within a desired degree of confidence prior to placement and wiring.

FIG. 5 shows an example of a cross-section of the above described tree-like classification structure 160 which may be constructed using the particular wire factors selected. The number of classification bins in the tree-like structure 160 corresponds to the number of wiring factor variables selected and the number of possible results for each of the wiring factors. Thus, for six wiring factors described above, i.e., technology, placement multiplier, buffer strength, layer length, fanout, number of aggressors and coupling factors, the number of bins is the product of each number of possibilities for each of the wire factors and the structure may have the general appearance of the example shown in FIG. 5. Accordingly, by constraining the particular wire factors selected and the granularity within each wire factor the number of bins may be managed to a reasonable number.

For example, the number of technologies may be held to two 162, 164, respectively, labeled G12 and Gflx in this example. Crosstalk multipliers may be constrained to two 166, 168, corresponding to a normal delay (unity) or a relaxed crosstalk delay at a 1.5 multiplier. Seven different buffer strengths may be selected represented by bins 170, 172, 174, corresponding to a minimum buffer strength of 0.5 to 1×, or buffer strength ranges of 2× to 4×, 5× to 8×, 9× to 12×, 15× to 15×, 16× to 25×, and greater than 25×, respectively, to provide for increasing buffer drive depending upon the expected load for a particular net. Layer length vector bins may be selected based on an expected maximum layer length. For example, 81 layer length vector bins represented by bins 176, 178, 180 may be selected to segment an expected maximum length of 4 millimeters, into nine 0.5 mm bins for each of nine individual layer length value ranges. Fanout can be constrained by design, however, fanout bins 182, 184, 186, typically, will cover ranges from one or two up to more than five. Aggressor number range bins 188, 190, 192, typically, can be selected for as many aggressor ranges as are deemed appropriate, such as 0 to 2, 2 to 4, 4 to 6 and more than 6. Coupling ratios which are dependent upon the victim and aggressor wire layers can be constrained to, for example, four coupling ratio bins represented by bins 194, 196, 198, each coupling ratio bin corresponding to one of a range from 0.0 to 0.25, 0.25 to 0.5, 0.5 to 0.75, or 0.75 to 1.0. It is understood that this WireFactor tree and associated wire factors are provided for example only and not intended as a limitation.

So, for this example the number of bins N=2×2×7×81× 5×4×4=181,440 bins, (i.e., 2 technologies×2 crosstalk multiplier ranges×7 buffer strength ranges times 81 layer length vector ranges×5 fanout ranges×4 aggressor ranges×4 coupling ranges) a small number by comparison to the number of cases considered by prior art analysis methods. Continuing this example, an average design containing on the order of three million wires, collecting statistics for 10 completed designs provides an average of 150 wires from each design in each of the nearly 200,000 bins and may be considered as representative data. At the bottom of the tree, the crosstalk data 194D, 196D, 198D is grouped for each bin. Each bin 194D, 196D, 198D is defined by walking through the tree to a bottom classification bin.

FIG. 6 shows a flow diagram 200, exemplary of the this phase of the preferred embodiment of the present invention wherein, average per stage crosstalk related delays are generated in major step 202 and included in the model for subsequent prewiring crosstalk analysis for new designs in step 204. First, in step 206, previous designs in a particular technology are collected. In step 208 crosstalk analysis is conducted on the selected previous designs and crosstalk reports are generated for those designs. In step 210, design statistics are collected from the crosstalk reports and statistics reports are generated. In step 212 the crosstalk and design statistics are mapped to particular bins and the tree-like storage structure is created. In step 214 crosstalk delay mean and standard deviation values are generated for each bin in the storage structure. These mean and standard deviation values are outputs from first major step 202 passed to the second major step 204 for use in subsequent delay calculations. In step 216, a new design is presented for analysis. In step 218 each path of the new design is selected, one by one, and each selected path is analyzed for crosstalk affects. In step 220 the raw delay DP along the path is calculated, i.e., without consideration of crosstalk. In step 222 a statistical crosstalk overhead along the selected path is generated using the mean and standard deviation generated from step 202. The confidence level is set in step 222 and the result is passed to step 224 wherein crosstalk overhead is calculated for the selected path. Based on this initial analysis, potential problems may be identified and the design may be modified to eliminate those errors prior to wiring.

FIG. 7 is a timing diagram showing an example of a typical path timing relationship between a start register 132 and a terminal register 134 as in FIGS. 3 and 4. The start register 132 is set by clock 230 and the terminating register 134 is set by clock 232. Clock launching edge 234 latches data into the start register 132, passing latch data out of the start register 132 to initiate signal propagation through the path P. The signal propagates through the path logic, emerging from the logic at the input pin D of the terminating register 132 at data arrival time 236. Capture edge 238 is the clock edge upon which the path datum latches into the terminating register 134. Typically, each flip flop or register requires a period of time known as the setup margin 240 after which data into the register must be maintained at a constant value in, order for the register to latch correctly. Also, typically, designs include a safety margin, some requisite advance data arrival time indicated by dashed line 242, in addition to the setup time at which time, the data path output is required to remain at a constant level. This safety margin is sometimes referred to as design margin and is included to compensate for process, voltage and temperature (PVT) variations, as well as delay variations from crosstalk between nets and further for inaccuracies in design models and process model algorithms. The excess time between the arrival of an input signal from the path at 236 and the required arrival 240 is known as the slack for the particular data path and is different for each path.

Critical paths are those paths where the slack is zero or close to zero for a particular design and may further include paths wherein slack falls below a design minimum for the design. Normally, the design margin is selected to accommodate for uncertainty in the design due to clock edge arrival, power supply voltage variability and for process variations. Setup margin usually is a constant for each particular technology, e.g. 10% of the clock period. Although normally a design consideration, for purposes of describing the present invention, clock skew is ignored and is treated as zero. Thus, as described herein slack is defined as the required input arrival time (i.e., clock edge—setup margin) minus the expected data arrival time and, is never allowed to be less than zero.

For any clock domain within a design, the design margin depends in large part on the particular design technology. If PVT, delay and other design parameter variations require increasing the margins then path delays must also be reduced in order to compensate. So, any change in the margins for one path constrains all paths in the clock domain for the particular technology. For non-critical paths that have a small path delay value and large slack this may be acceptable. However, this tighter constraint is not acceptable in critical paths. Further, some paths that may not be critical prior to slack reduction and may become critical because of the reduced slack.

Accordingly, path crosstalk delays may be considered in early design stages by adjusting design and setup margins during physical design to anticipate likely crosstalk. This minimizes the impact to the finally placed and wired design to within a selected level of confidence or certainty. Thus, running expensive time-consuming design analysis tools after wiring a design is no longer a design requirement because crosstalk design violations have been avoided to within that level of certainty.

So, the setup margin may selectively be changed for any particular register (or flip flop) such as the terminating register 134. For each register, the setup margin may depend upon the technology, the clock domain and the maximum number of cells among all paths ending in that terminating register. By increasing the required register setup margin, the acceptable delay is reduced through all paths ending in that register. However, only those paths that have path delays long enough that the margin becomes insufficient (i.e., slack becomes negative) as a result of this change need be considered for further analysis as requiring timing adjustment or redesign. Typically, shortening either of the setup or design margins places additional constraints on cells within the path or within the paths to the register being considered. Meeting those additional constraints may require, for example, increasing cell power levels in one or more cells. This increased setup margin analysis may be done using a Standard Delay Format (SDF) file for a particular design by introducing an incremental addition to the setup margin for one or more particular flip flops or registers being considered. One present drawback to this approach is that any change in setup margin constrains all paths. However, the preferred embodiment of the present invention more precisely determines the likely delay through any particular path because, individual setup times and margins are assigned to individual registers or flip flops in individual paths.

First, using the above described method 200 of FIG. 6, a crosstalk overhead is calculated for each path. As represented in FIG. 8, crosstalk overhead can be inserted into the path delay to get a closer more accurate estimate of the actual arrival time and so, a truer estimate of the slack available in each path. This estimate is more accurate because uncertainty is removed by adding more representative crosstalk overhead to the original data arrival edge 236 to provide an updated data arrival edge 242. So, the slack value, may be reduced because crosstalk overhead no longer must be considered as an unknown delay factor, since expected crosstalk is no longer an unknown or an unquantifiable value for the path.

FIG. 9 shows a path 250 terminating in terminal register 134, including paths indicated by arrows 252, 254, 256, 258 and 260 that are of various lengths representative of path delays, figuratively referred to as the Tcone (=the cone for cell T) 262 of register 134. Sensitivity to crosstalk in the path 250 is inversely proportional to the closeness to the terminating register 134 at which the particular Tcone path 252, 254, 256, 258, 260 merges with main path 250. Thus, path 252 is more sensitive to crosstalk than path 254, etc. So, the preferred embodiment r, crosstalk delay estimator of the present invention determines a delay overhead for each Tcone to assist in developing a crosstalk delay margin guideline. In particular, each register or flip flop is considered for each clock domain and for each considered register, the longest path terminating in the register is identified. The setup crosstalk overhead for terminating register can be identified using the relationship $$O^S = \max\{O_R^S(n)\} = O_P^S(n_{max})$$

where $n_{max}$ is the largest number of cells in one path of all the paths in the Tcone of the particular register.

FIG. 10 shows an example of an additional refinement step 270 for setting and adjusting timing margins of a design according to the present invention. The design is input in step 272. In step 274 the clock domain variable CLK domain is set to point to the first clock domain in the design. In step 276 the first instance of a register in the current clock domain is selected as a terminating register. In step 278 traversing back from the terminating register, a Tcone is identified. In step 280 a check is made to determine whether the simplified analysis is to be run wherein overhead differences for different registers are to be ignored. If not, continuing to step 282 the crosstalk overhead is calculated for the path using the selected confidence level in 284. Then, in step 286 the calculated overhead is added to the SDF file as an incremental part of the setup margin for the current selected terminating register. In step 288 a check is made to determine whether all instances of registers were considered. If additional registers remain to be considered then in step 290 the next register instance is set as a current terminating register and returning to step 278 that next register is considered. If in step 280 the simplified margin is indicated such that overhead differences for different registers are to be ignored then, in step 292 the simplified overhead margin is calculated for the path as described above, using the confidence level from 284. In step 294 that simplified overhead margin is added to the SDF file and provided as an incremental part of the setup margin for registers of the whole clock domain. In step 288 if all instances of registers have been considered, then in step 296 a check is made to determine whether, all clock domains have been considered for the design. If not, in step 298 the current clock domain is set to point to the next clock domain and, returning to step 276 the first instance of a register for that clock domain is selected. Once it is determined in step 246 that all clock domains have been considered, then, the design is complete in step 300.

FIG. 11 shows a timing diagram illustrating an incremental addition of the crosstalk overhead value to the setup margin as a result of the identified crosstalk setup overhead. As noted above, the crosstalk setup overhead is an incremental addition, to the setup margin in the SDF file. Thus, the crosstalk setup overhead as represented by the gap between timing edges 310 and 240 may be included in the design to define the relationship New setup margin=Library setup margin−$O^S$ which reduces uncertainty as well as both slack and margin.

This crosstalk overhead setup can be simplified by ignoring crosstalk overhead differences for registers, wherein simplified margin ($O^{SM}$) is defined by the relationship $$O^{SM} = \max\{O_P^S(N)\} = O_P^S(n_{max})$$

P∈Design.

As can be seen from the timing diagram of FIG. 11, the new margin can be defined as the combination of the old margin and the simplified crosstalk setup overhead.

Accordingly, having derived the stochastic delay model described with reference to FIG. 5 and the extraction method of FIG. 6 and having stored delay values separately, the stochastic delay model may be combined with simplified Static Timing Analysis (STA) consistent with the stochastic model to provide the preferred embodiment placement method wherein, because crosstalk overhead may be analyzed prior to placement, it may be avoided. Using the method of the preferred embodiment designers may generate an SDF file with crosstalk delays. In particular, path crosstalk delay is determined prior to placement for any path. Using the simplified crosstalk path delay analysis method described hereinabove, the standard path delay calculation ($O^S_P$) can be used to determine path delays while coincidentally accounting for expected crosstalk overhead within the path.

FIG. 12 shows an example of a path 320 similar to the path of the example of FIGS. 3, 4 and 9. In this example the path 320, which originates from starting register 132, includes an intermediate terminating register 322. As described hereinabove, critical path timing analysis for this path is done for delays between starting register 132 and terminating register 134. According to the preferred embodiment of the present invention all paths between pairs of starting registers 132 and terminating registers 134 or 322 are evaluated, path by path. Further, each net delay, i.e., between a starting cell pin and a terminating cell pin, is considered individually. For simplicity of discussion, but for example only, paths are described herein with reference to connected cells by an alphanumeric designation for the cell, output pins are alphabetically designated, and input pins are numerically designated. Each cell output is paired with an input to another cell, output cells are listed first, followed by the input cell. Paths are described in order, cell output to cell input for each net, e.g., (R1.Q, C1.2), and net to net. So, for example, primary path 324 includes the following pairs: (R1.Q, C1.2), (C1.z, C2.1), (C2.s, C3.t), (C3.z, C4.1), (C4.z, C5.2) (C5.z, R3.D) with (C2.s, C3.t) designating a shared net for consideration. Path 324 begins at start register 132 and continues to terminating register 134, designated pair (s,t) being (C2, C3). This example includes an intersecting path 326 which passes through pair (s,t) as (P2, C1.z, C2.1), (C2.s, C3.t), (C3.z, R2.D, C4.1).

To identify the maximum path through a pair, a start register is selected and a path to a terminating register is identified beginning at that start register. This first path is identified as the maximum path through (s,t) and $n_{max}$ is set to the number of cells in that path, i.e., the starting and terminating cells of one or more shared nets.

Then, other paths to other registers are identified and, if they include more cells, n is set to the higher number cells for that path. After consideration of all paths {P}, for each, pair (s,t), $n_{max}$(s,t) contains the length (in number of cells) of the maximum path that goes through the pair.

FIG. 13 is an example of a cross section showing net 330 in further detail.

In particular, net 330 includes start cell 332, driven terminating cells 334, 336, 338, as well as terminating register 340. On a stage-by-stage basis, constraining analysis for every pair such that each cell pair is treated as part of a maximum path of FIG. 12, the crosstalk overhead for each path segment can be represented as:

$$O(s, t) = \mu_{dt}(WireFactors) + \frac{c \cdot \sigma_{dt}(WireFactors)}{\sqrt{n_{max}(s, t)}}$$

It should be noted that this relationship holds for each net in the path (s,t) because the path crosstalk overhead is calculated for the maximum path. Therefore, cells not in the maximum path exhibit less crosstalk sensitivity than cells in the maximum path. Thus, the net delay may be represented as the sum of the raw net delay (i.e., free of crosstalk) in combination with the crosstalk overhead delay as represented by:

$$D^X(s,t) = D(s,t) + O(s,t)$$

Thus, using the above described method wherein the lumped path crosstalk overhead is calculated for the entire path and then extracting net crosstalk overhead for each individual net, individual net delays can be combined to calculate any path delay with a selected confidence level that the actual path delay will never exceed the calculated path delay. In particular, for the maximum path, the delay results are identical, i.e., $D_P = D_P^L$, where $D_P^L$ is the sum of individual cell by cell delays and where is the previously described calculated path delay, i.e., the path delay is combined with the lumped path crosstalk overhead delay. As described above, as each crosstalk delay is calculated for each net, it is written to the SDF file.

FIG. 14 is an example of a flow diagram 350 for first calculating individual net delays for the path according to the preferred embodiment of the present invention. In step 352 the design is provided for analysis. In step 354 a counter holding the current maximum number of cells in a path is initialized to zero. Simultaneously, in step 356 the design is searched to identify all paths, i.e., starting and terminating (s,t) pairs. Then, in step 358 a first path is selected as the current path. In step 360 the first net in the current path is identified. In step 362 a check is made to determine whether the current path is longer than any previously identified maximum path length, i.e., a path previously identified as including the largest number of cells. Initially, since the number of cells in every path is set to zero, the first path will be the largest path in this step, thereafter larger and smaller paths may be identified; and, only when a larger path is identified is it set to the largest path in step 364. If in step 362 the current path does not contain more cells than the previously identified maximum number of cells, then step 364 is skipped. Continuing to step 366 a check is made to determine whether all paths have been evaluated. If paths remain to be evaluated, then, in step 368 the next pair of source and terminating registers is identified to select the next path and, returning to step 360 that path is set as the current path. Otherwise, once all paths have been considered in step 366, the maximum path length has been identified and is $n_{max}$(s,t).

So continuing to step 370, the current net pointer is again set to the first net in the path. Then, in step 372 the raw net delay is calculated for the current net. In step 374 the crosstalk overhead is calculated for the current net and added to the raw net delay to determine the simplified full path delay. In step 376 the calculated net delay for the current net is inserted in the SDF file. In step 378 a check is made to determine whether a delay has been calculated for all nets in the current path. If delays have not been calculated for all nets, then, in step 380 a next net is assigned as the current net and, returning to step 372, the raw path delay is calculated for that current path at least through the current net. Otherwise, if the delay has been calculated for all the nets in the current path, then a check is made in step 382 to determine whether all paths have been considered. If all paths have not been considered, in step 384 the next path is selected as the current path and, returning to step 360, the first net is selected as a current net from the current path. Otherwise, processing ends in step 386.

In addition to analyzing path delay for each path among all paths between a start register and terminating register, the preferred embodiment of the present invention also allows for path-by-path analysis of path delays within each clock domain. Referring again to the Tcone of FIG. 9, the preferred embodiment method finds the longest path in the Tcone in terms of cells in the critical path. Wiring delay of each net of the Tcone is considered. Net delays D(s,t) are calculated from the net driver output to the destination pin in each net of the cone. The net delay is written to the SDF file and then, path crosstalk overhead is determined for the path and also added to the SDF file. The crosstalk overhead for the critical path is derived using the stochastic model and at a level of confidence selected by a user. The derived crosstalk is then added to the SDF file in combination with register setup margin. This is all done automatically, while interactively providing the designer with an option of selecting and including crosstalk overhead calculation in design analysis. Also, optionally, the level of confidence may be provided in a percentage instead of in a sigma multiplier and, the corresponding sigma multiplier derived from the percentage.

FIG. 15 is a flow diagram of the second calculation mode 390 according to the preferred embodiment of the present invention. Again, in step 392 the current design is provided, i.e., input to a computer for analysis. In step 394 the first clock domain is selected and set to the current clock domain. In step 396 all Tcones within the current clock domain are identified. In step 398 the first Tcone is selected as the current Tcone. In step 400 the longest path in the current Tcone is identified. In step 402, the first net is selected within the longest path and in step 404 the first pair in the net is selected. In step 406, the raw net delay for the selected pair is written to the SDF file. In step 408 a check is made to determine whether all of the pairs have been selected and raw delays written to the SDF file. If other pairs have not yet been considered, then, in step 410 the next pair is selected and set to the current pair in 404. Iteratively, all of the pairs in the current net are selected and raw net delays for each of the pairs are provided to the SDF file. Once in step 408 all the pairs are determined to have been considered, then, in step 412 a check is made to determine whether all the nets in the current clock domain have been considered. If not, in step 414 the next net is selected and, returning to step 404 the first pair in the next net is set to the current pair. Once all nets have been considered in step 410, the overhead crosstalk delay is calculated for the longest path in step 416 and written to the SDF file. The path crosstalk overhead delay may be calculated using the above described stochastic model, provided in 418 and with the level of confidence set in 420. In step 422 a check is made to determine if all registers have been considered and, if not, in step 424 the next instance of a register in the current clock domain is selected. Returning to step 400, the longest path is identified for that instance of that register for the Tcone. Otherwise, if all registers have been considered, in step 424 a check is made to determine whether any clock domains remain to be considered. If so, in step 428 the current clock domain is set to point to the next clock domain. In step 398 the first Tcone is selected for that current clock domain and analysis continue's. Otherwise, in step 430 analysis is complete.

Thus, potential crosstalk related problems are identified early, prior to wiring and, in particular, prior to initial or final placement, thereby avoiding potentially time consuming post design crosstalk analysis that may or may not lead to an acceptable design solution. Instead, the user has an opportunity to correct any potential problems prior to placement and wiring. So, the user knows within a selected level of confidence prior to placement that the finally placed and wired design will not have crosstalk problems or errors associated therewith.

While the invention has been described in terms of preferred embodiments, those skilled in the art will recognize that the invention can be practiced with modification within the spirit and scope of the appended claims.

What is claimed is:

1. A method of integrated circuit design comprising steps of:
    (a) identifying a longest path for each cell pair in a design;
    (b) calculating a raw net delay through said longest path of said each cell pair;
    (c) calculating a crosstalk overhead delay for said each cell pair;
    (d) generating a net delay for said each cell pair from said raw net delay and said crosstalk overhead delay; and
    (e) identifying path delays from said net delay exceeding a specified maximum path delay.

2. A method as in claim 1 wherein step (a) of comprises steps of:
    (i) identifying all paths in said design;
    (ii) selecting a path and identifying a longest path length for each cell pair in said selected path;
    (iii) calculating a path length for said each cell pair originating at a starting register of said selected path;
    (iv) repeating steps (ii) through (iii) until a longest of all of said paths of each cell pair of said design is identified.

3. A method as in claim 2 wherein step (iii) comprises steps of:
    (A) selecting a cell pair of said selected path;
    (B) identifying a longest path through said selected cell pair; and
    (C) repeating steps (A) through (B) until all cell pairs in said selected path have been selected.

4. A method as in claim 3 wherein cell pairs are selected sequentially from a starting register of said selected path.

5. A method as in claim 4 wherein after step (b), said raw net delay for said selected cell pair through said identified longest path is written to a data file.

6. A method as in claim 1 wherein after step (b), said raw net delay through said identified longest path for each cell pair is written to a data file.

7. A method as in claim 5 wherein step (c) comprises steps of:
    (c1) calculating a path crosstalk overhead delay of said identified longest path;
    (c2) calculating a net crosstalk overhead delay for said each cell pair through said identified longest path; and
    (c3) storing said calculated net crosstalk overhead delay.

8. A method as in claim 6 wherein step (d) comprises steps of:
    (i) adding said crosstalk overhead delay to said raw net delay for said identified longest path; and
    (ii) writing said crosstalk overhead delay to said data file.

9. A method as in claim 1 wherein step (e) comprises identifying nets having a distance between placed cells exceeding a net crosstalk maximum length.

10. A method as in claim 1 wherein said crosstalk overhead delay is calculated in step (c) using a stochastic model.

11. A method as in claim 10 wherein said stochastic model is created by a method comprising steps of:
providing a plurality of completed integrated circuit designs, each containing cell placement and wiring for the completed integrated circuit design;
analyzing said plurality of completed integrated circuit designs for crosstalk and storing the results of said analysis;
generating crosstalk related design statistics on each of said plurality of completed integrated circuit designs;
building a tree-like structure representative of design wiring factors;
mapping said crosstalk related design statistics to said tree-like structure; and
calculating statistical values relating each bin of said tree-like structure with crosstalk delays.

12. A method as in claim 1 further comprising a step of:
(f) analyzing path lengths within each clock domain of said design.

13. A method as in claim 12 wherein step (f) comprises steps of:
(i) selecting a clock domain of said design;
(ii) selecting a path within said clock domain;
(iii) selecting a plurality of paths that are merged with said selected path at a terminating register in said selected path;
(iv) identifying said longest path in said selected plurality of paths;
(v) repeating steps (ii) through (iv) until all paths within said clock domain have been selected; and
(vi) repeating steps (i) through (v) until all clock domains of said design have been selected.

14. A method of integrated circuit design comprising steps of:
(a) identifying a longest path for each cell pair from each starting register in each clock domain of a design;
(b) calculating a raw net delay for each said cell pair through said identified longest path;
(c) calculating a crosstalk overhead delay for each identified longest path;
(d) generating a net delay for said each cell pair from said raw net delay and said crosstalk overhead delay; and
(e) identifying paths from said net delay having a path delay exceeding a specified maximum path delay.

15. A method as in claim 14 wherein step (a) comprises steps of:
(i) identifying all paths in said design;
(ii) selecting a clock domain of said design;
(iii) selecting a path in said selected clock domain;
(iv) identifying a longest path length for each cell pair in said selected path;
(v) repeating steps (iii) and (iv) until each path is selected in said selected clock domain; and
(vi) repeating steps (ii) through (v) until all clock domains of said design have been selected.

16. A method as in claim 15 wherein step (iv) comprises selecting each cell pair sequentially from a starting register of said selected path.

17. A method as in claim 15 wherein step (iv) comprises steps of:
(A) identifying a plurality of paths that are merged with said selected path at a terminating register in said clock domain of said design;
(B) identifying each net in said plurality of paths; and
(C) calculating a net delay for said identified each net.

18. A method as in claim 17 wherein after step (b), said raw net delay is written to a data file.

19. A method as in claim 18 wherein step (c) comprises steps of:
(c1) calculating path crosstalk overhead delay for each said identified longest path; and
(c2) calculating a net delay for said each cell pair from said raw net delay and said calculated path crosstalk overhead.

20. A method as in claim 19 wherein step (d) comprises steps of:
(d1) adding said net crosstalk overhead to said net delay for said identified longest path; and
(d2) writing said crosstalk overhead delay to a data file.

21. A method as in claim 20 wherein step (e) comprises identifying nets having a distance between placed cells exceeding a net crosstalk maximum length.

22. A method as in claim 21 wherein said crosstalk overhead delay is calculated using a stochastic model.

23. A method as in claim 22 wherein path delays are determined in step (e) to within a selected level of confidence.

24. A method as in claim 22 wherein said stochastic model is created by a method comprising steps of:
providing a plurality of completed integrated circuit designs, each containing cell placement and wiring for the completed integrated circuit design;
analyzing said plurality of completed integrated circuit designs for crosstalk and storing the results of said analysis;
generating crosstalk related design statistics on each of said plurality of completed integrated circuit designs;
building a tree-like structure representative of design wiring factors;
mapping said crosstalk related design statistics to said tree-like structure; and
calculating statistical values relating each bin of said tree-like structure with crosstalk delays.

25. A circuit design system comprising:
means for identifying a longest path through each net of a design;
means for determining a raw net delay for said each net;
crosstalk calculation means for calculating crosstalk overhead for each identified longest path;
means for generating a net delay for said each net from said raw net delay and said crosstalk overhead; and
path analysis means for identifying paths from said net delay having a path delay exceeding a specified maximum path delay.

26. A circuit design system as in claim 25 wherein said means for identifying a longest path comprises:
means for identifying all paths in said design;
means for selecting nets in each of said paths;
means for identifying all paths through each of said selected nets; and
means for counting cells in each of said paths identified through each of said selected nets, said longest path having a highest number of cells.

27. A circuit design system as in claim 26 wherein said means for determining raw net delay comprises:
means for determining a path delay through each said longest path; and means for determining a net delay for each net in said longest path from said path delay.

28. A circuit design system as in claim 27 wherein said means for determining a net delay comprises means for combining crosstalk overhead with raw net delays.

29. A circuit design system as in claim 28 further comprising:
   means for identifying all paths within a clock domain of said design; and
   means for identifying a plurality of paths that are merged with one of said paths within said clock domain at a terminating register for each path within said clock domain.

30. A computer program product for designing integrated circuits, said computer program product comprising a computer usable medium having computer readable program code thereon, said computer readable program code comprising:
   computer program code means for identifying a longest path through each net of a design;
   computer program code means for determining a raw net delay for said each net;
   computer program code means for calculating crosstalk overhead for each identified longest path;
   computer program code means for generating a net delay for said each net from said raw net delay and said crosstalk overhead; and
   computer program code means for identifying paths from said net delay having a path delay exceeding a specified maximum path delay.

31. A computer program product as in claim 30 wherein said computer program code means for identifying a longest path comprises:
   computer program code means for identifying all paths in said design;
   computer program code means for selecting nets in each of said paths;
   computer program code means for identifying all paths through each of said selected nets; and
   computer program code means for counting cells in each path identified through said selected nets, said longest path having a highest number of cells of said paths through said selected nets.

32. A computer program product as in claim 31 wherein said computer program code means for determining raw net delay comprises:
   computer program code means for determining a path delay through each said longest path; and
   computer program code means for determining a net delay for each net in said longest path from said path delay.

33. A computer program product as in claim 32 wherein said computer program code means for determining a net delay comprises means for combining crosstalk overhead with raw net delays.

34. A computer program product as in claim 33 further comprising:
   computer program code means for identifying all paths within a clock domain of said design; and
   computer program code means for identifying a plurality of paths that are merged with one of said paths within said clock domain at a terminating register for each path within said clock domain.

* * * * *